United States Patent
Taylor (10) Patent No.: US 9,892,768 B2
(45) Date of Patent: Feb. 13, 2018

(54) LATCHING PSEUDO-DUAL-PORT MEMORY MULTIPLEXER

(75) Inventor: Gary L. Taylor, Windsor, CO (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 1271 days.

(21) Appl. No.: 13/404,860

(22) Filed: Feb. 24, 2012

(65) Prior Publication Data

US 2013/0227223 A1    Aug. 29, 2013

(51) Int. Cl.
*G11C 7/10* (2006.01)
*G11C 8/06* (2006.01)

(52) U.S. Cl.
CPC ............ *G11C 7/1075* (2013.01); *G11C 7/109* (2013.01); *G11C 8/06* (2013.01); *G11C 2207/2209* (2013.01)

(58) Field of Classification Search
CPC ................. G11C 7/1075; G11C 7/109; G11C 2207/2209; G06F 13/1652; G06F 13/1657; G06F 13/1663; G06F 15/163; G06F 15/167
USPC .................................................. 711/154, 149
See application file for complete search history.

(56) References Cited

U.S. PATENT DOCUMENTS

| | | | |
|---|---|---|---|
| 5,542,067 A * | 7/1996 | Chappell et al. | 711/167 |
| 6,259,648 B1 * | 7/2001 | Kragick | 365/230.05 |
| 6,650,575 B1 | 11/2003 | Khanna | |
| 6,788,589 B2 | 9/2004 | Faue | |
| 6,882,562 B2 | 4/2005 | Beucler | |
| 7,230,856 B1 | 6/2007 | Venugopal et al. | |
| 7,793,178 B2 | 9/2010 | Sinha et al. | |

FOREIGN PATENT DOCUMENTS

WO    9411828 A2    5/1994

* cited by examiner

*Primary Examiner* — Edward Dudek, Jr.
*Assistant Examiner* — Andrew Russell
(74) *Attorney, Agent, or Firm* — Sheridan Ross P.C.

(57) ABSTRACT

A pseudo-dual-port (PDP) memory system includes a memory array, timing and control logic, and multiplexer-latch (MUX-latch). The MUX-latch comprises integrated address selection logic and latching logic, such that the combination multiplexes and latches an address in a single change in response to a state change in the read select or write select signals. The multiplexing and latching defines a single operation or state change in the MUX-latch. Since the multiplexing delay and the latching delay for a read operation are coincident with each other rather than being incurred one after the other, memory read operations are fast.

19 Claims, 5 Drawing Sheets

LATCHING PSEUDO-DUAL-PORT MEMORY MULTIPLEXER

BACKGROUND

A processor generally can perform either a read operation or a write operation but not both upon a memory array, such as a random access memory (RAM) array, during a single clock cycle. This type of memory is sometimes referred to as single-port memory to contrast it with dual-port memory, which is a type of memory that accommodates a processor performing both a read operation and a write operation during a single clock cycle. As a dual-port memory cell occupies a greater amount of space on an integrated circuit chip than a cell of the aforementioned (single-port) type of memory, a hybrid type of memory that is sometimes referred to as pseudo-dual-port (PDP) memory was developed that can accommodate both a read operation and a write operation during a single clock cycle while occupying less chip area than an equivalent amount of true dual-port memory. A characteristic of PDP memory is that a read operation always immediately precedes a write operation by one half clock cycle.

Figure 1:
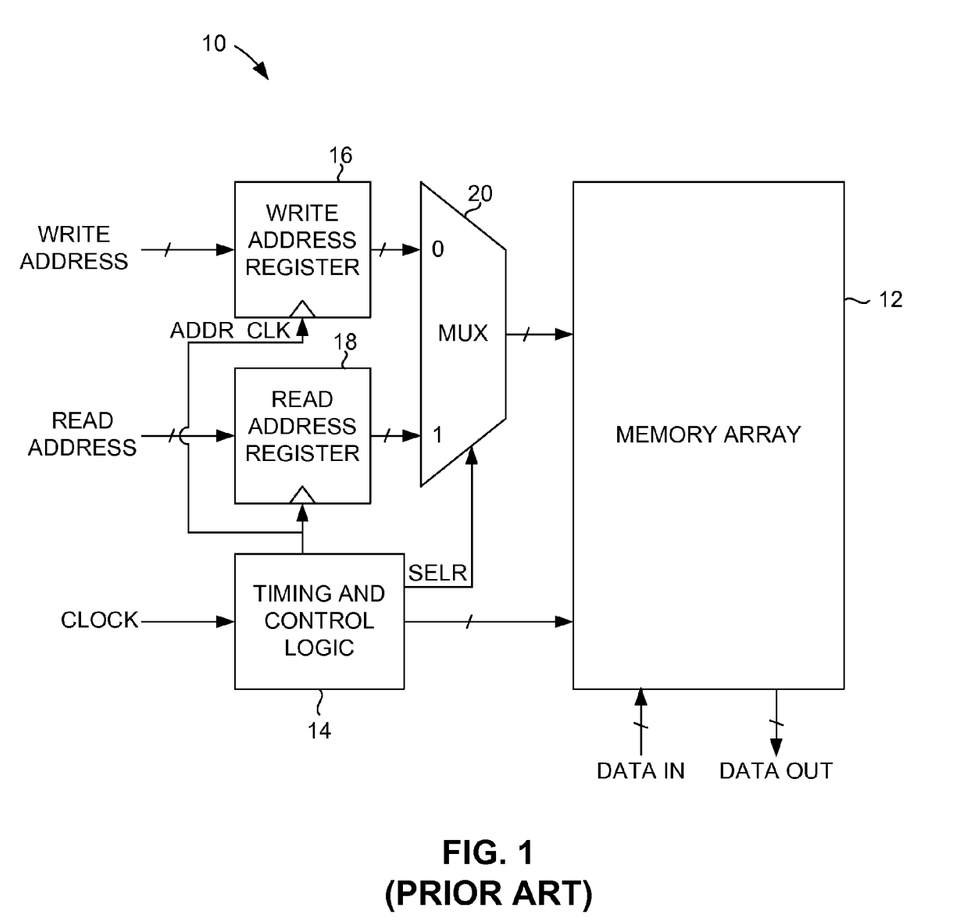
FIG. 1 is a block diagram of a PDP memory system in accordance with the prior art.

As illustrated in FIG. 1, a conventional PDP memory system 10 includes, in addition to a memory array 12 and control logic 14, a write address register 16, a read address register 18, and an address multiplexer (MUX) 20. The presence of an address MUX that selects or multiplexes both a read address and a write address in association with a single clock cycle is a characteristic of PDP memory.

Figure 2:
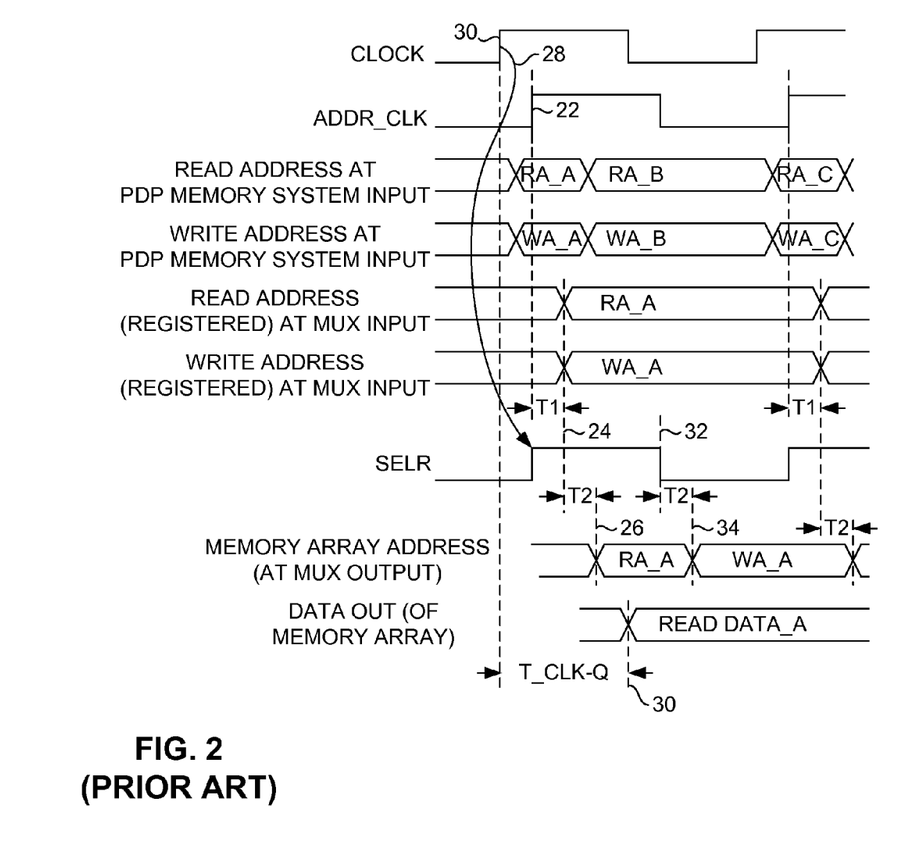
FIG. 2 is a timing diagram illustrating an exemplary instance of operation of the PDP memory system of FIG. 1

Timing and control logic 14 generates a delayed clock signal or address clock ("ADDR_CLK") from the master clock signal ("CLOCK") as well as signals that directly control memory array 12, such as signals along the lines of those commonly referred to in memory systems as write enable and read enable and other control signals. As illustrated in FIG. 2, the write address that is input to PDP memory system 10 (FIG. 1) is registered into write address register 16 in response to the rising edge of the address clock at time 22. Likewise, the read address that is input to PDP memory system 10 (FIG. 1) is registered into read address register 18 in response to the rising edge 22 of the address clock. The write and read addresses that are registered or stored in address registers 16 and 18, respectively, are thus presented to the input of address MUX 20 at time 24. Note the delay T1 between the rising edge 22 of the address clock and the registering of the read and write addresses at time 24. This delay T1 is inherent in the operation of each of write and read address registers 16 and 18.

Timing and control logic 14 also generates a MUX control signal ("SELR") that is similar to the master clock and address clock signals. As indicated by the curved arrow 28, the length and duty cycle of the MUX control signal is determined by a timer (not separately shown) in timing and control logic 14. While the MUX control signal remains high, address MUX 20 selects or passes the registered read address through to its output. Note the delay T2 between time 24 and the time 26 at which MUX 20 outputs the read address. This delay T2 is inherent in the operation of MUX 20. For example, a first exemplary read address ("RA_A") is output by MUX 20 at time 26.

In response to the first exemplary read address, memory array 12 (FIG. 1) reads the memory location represented by RA_A and, at time 30, outputs a first exemplary data value ("READ DATA_A") that was stored at that memory location. Note the memory access time represented by the interval between time 26 and the time 30. This memory access time is inherent in the operation of memory array 12. Also note the total time, commonly referred as clock-to-Q time ("T_CLK-Q"), between the rising edge 30 of the clock signal and the output data appearing at the data output of memory array 12. The reading of the first exemplary data value represents the completion of the first half of this exemplary read-write cycle. Additional read and write addresses, such as a second exemplary read address "RA_B," a second exemplary write address "WA_B," a third exemplary read address "RA_C," and a third exemplary write address "WA_C," can be input to PDP memory system 10 and processed in the same manner described herein. However, for brevity, only the read operation associated with the first exemplary read address is described herein.

The second half or "write" half of the exemplary read-write cycle begins at time 32 when the MUX control signal transitions from high to low. While the MUX control signal remains low, address MUX 20 selects or passes the registered write address through to its output. Note the same delay T2 between time 32 and the time 34 at which MUX 20 outputs the write address. For example, a first exemplary write address ("WA_A") is output by MUX 20 at time 34. In response to the first exemplary write address, memory array 12 writes input data (not shown) to the memory location represented by WA_A. As noted above, for brevity, and because persons skilled in the art understand the operation of PDP memory system 10, neither this write operation nor subsequent read or write operations are described in further detail herein.

It would be desirable to increase the speed at which memory operations can be performed in a PDP memory system.

SUMMARY

Embodiments of the invention relate to a pseudo-dual-port (PDP) memory system and method of operation. In an exemplary embodiment, a PDP memory system includes a memory array, timing and control logic, and a multiplexer-latch (MUX-latch). The memory array can perform read operations and write operations in association with a master clock signal in the same manner as memory arrays of conventional PDP memory systems. The timing and control logic can generate control signals, including a read select signal and a write select signal. The read select and write select signals allow both a read operation and a write operation to be performed upon the memory array in association with a single master clock signal cycle. The MUX-latch can comprise integrated address selection logic and latching logic, such that the combination multiplexes and latches an address in response to a single change in state of the read select or write select signals.

In the exemplary embodiment, the write address that defines an input of the PDP memory system is provided to a write address register and is registered (i.e., temporarily stored) therein in response to an address clock signal, while the read address that defines an input of the PDP memory system is provided directly (i.e., without registering it) to an input of the address selection logic on the same cycle of the master clock signal as the write address is provided to the write address register.

In the exemplary embodiment, a write operation is performed immediately following a read operation and in association with the same cycle of the master clock signal as the write operation. In association with the read operation, the timing and control logic generates the read select signal in association with that cycle of the master clock signal. Also in association with the read operation, the address selection logic selects the read address in association with the same above-referenced cycle of the master clock signal in response to the read select signal. Further in association with the read operation, the latching logic latches the read address directly from the input of the address selection logic to an address input of the memory array in association with the read operation in response to the read select signal. In association with the write operation, the timing and control logic generates the write select signal in association with the same above-referenced cycle of the master clock signal referenced above. Also in association with the write operation, the address selection logic selects the write address in association with the above-referenced cycle of the master clock signal in response to the write select signal. Further in association with the write operation, the latching logic latches the registered write address to the address input of the memory array in association with the above-referenced cycle of the master clock signal in response to the write select signal.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 3:
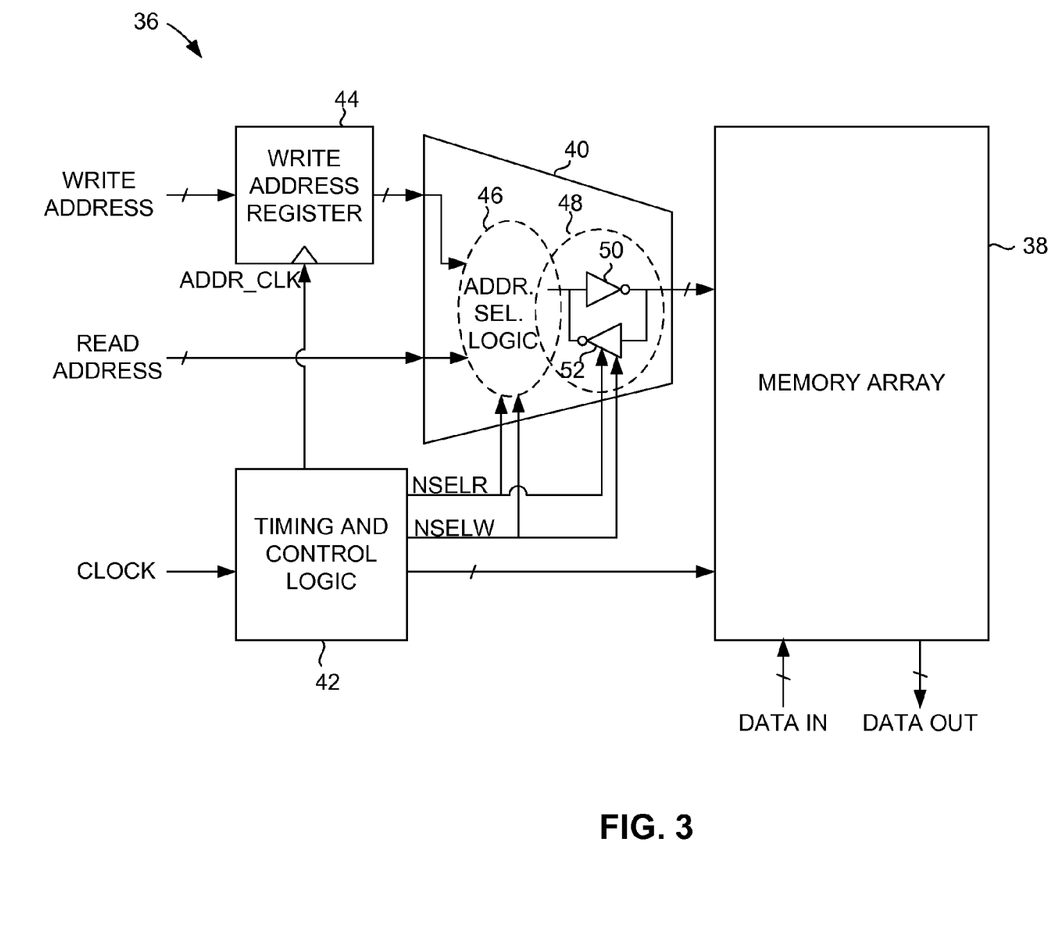
FIG. 3 is block diagram of a PDP memory system in accordance with an exemplary embodiment of the present invention.

As illustrated in FIG. 3, in an illustrative or exemplary embodiment of the invention, a pseudo-dual-port (PDP) memory system 36 includes a memory array 38, a multiplexer-latch (MUX-latch) 40, timing and control logic 42, and a write address register 44. Memory array 38 can be of any suitable single-port type, such as the type commonly included in conventional PDP memory systems. An example of a conventional PDP memory system is described in U.S. Pat. No. 6,882,562 to Beucler, entitled "Method and Apparatus for Providing Pseudo 2-Port RAM Functionality Using a 1-Port Memory Cell," the specification of which is incorporated herein by this reference. As PDP memory systems are well understood by persons of skill in the art, aspects of the exemplary embodiment that are within the knowledge of such persons are not described herein.

The inputs to PDP memory system 36 include a master clock signal ("CLOCK"), a read address and a write address. Timing and control logic 42 uses the master clock signal to generate (or stated another way, generates in response to the master clock signal) an address clock signal ("ADDR_CLK"). As described in further detail below, in the exemplary embodiment the address clock has the same duty cycle and period as the master clock but is delayed from the master clock. In other embodiments, the address clock can have any other suitable relationship to or association with the master clock. Timing and control logic 42 also uses the master clock signal to generate control signals that aid memory array 38 in effecting read and write operations. As such control signals are well understood by persons of skill in the art, the generation of these control signals by timing and control logic 42 is not described in further detail herein. Timing and control logic 42 further uses the master clock signal to generate a read select signal ("NSELR") and a write select signal ("NSELW"). Although in the exemplary embodiment the read select and write select signals are active-low signals (as indicated by signal names beginning with "N"), in other embodiments the read select and write select signals can be active-high signals. MUX-latch 40 receives and uses the read select and write select signals in the manner described below.

The write address that is input to MUX-latch 40 is registered. That is, the write address that defines an input of PDP memory system 36 is clocked into write address register 44 by a rising edge of the address clock, and the output of write address register 44 is connected to the write address input of MUX-latch 40. PDP memory system 36 does not include a read address register analogous to write address register 44. Rather, the read address that defines an input of PDP memory system 36 is directly input to MUX-latch 40, i.e., without first being stored in a register.

MUX-latch 40 includes two integrated or overlapping portions: address selection logic 46 and latching logic 48. Address selection logic 46 and latching logic 48 are integrated or overlap in the sense that it is only in combination that they multiplex and latch an address. That is, as described in further detail below, the combination both multiplexes and latches an address in response to a single change in state of the read select signal or a single change in state of the write select signal. Although a read address and a write address are input to address selection logic 46, and latching logic 48 outputs multiplexed and latched read and write addresses, latching logic 48 is not a separate and distinct logic stage connected to an output of address selection logic 46. As described in further detail below, the multiplexing (or address selection) and latching defines a single operation or state change in MUX-latch 40.

Latching logic 48 comprises circuitry that can be characterized as a pair of inverters 50 and 52 arranged in a complementary or circular manner, i.e., with the input of inverter 50 connected to the output of inverter 52, and the output of inverter 50 connected to the input of inverter 52. The output of latching logic 48 defines the output of MUX-latch 40 and is connected directly (i.e., through no intermediary elements) to the memory array address input of memory array 38. Inverter 52 functions as a feedback path with respect to the output of latching logic 48. Inverter 52 can be controlled by the read select and write select signals to control the latching function, as described in further detail below.

Figure 4:
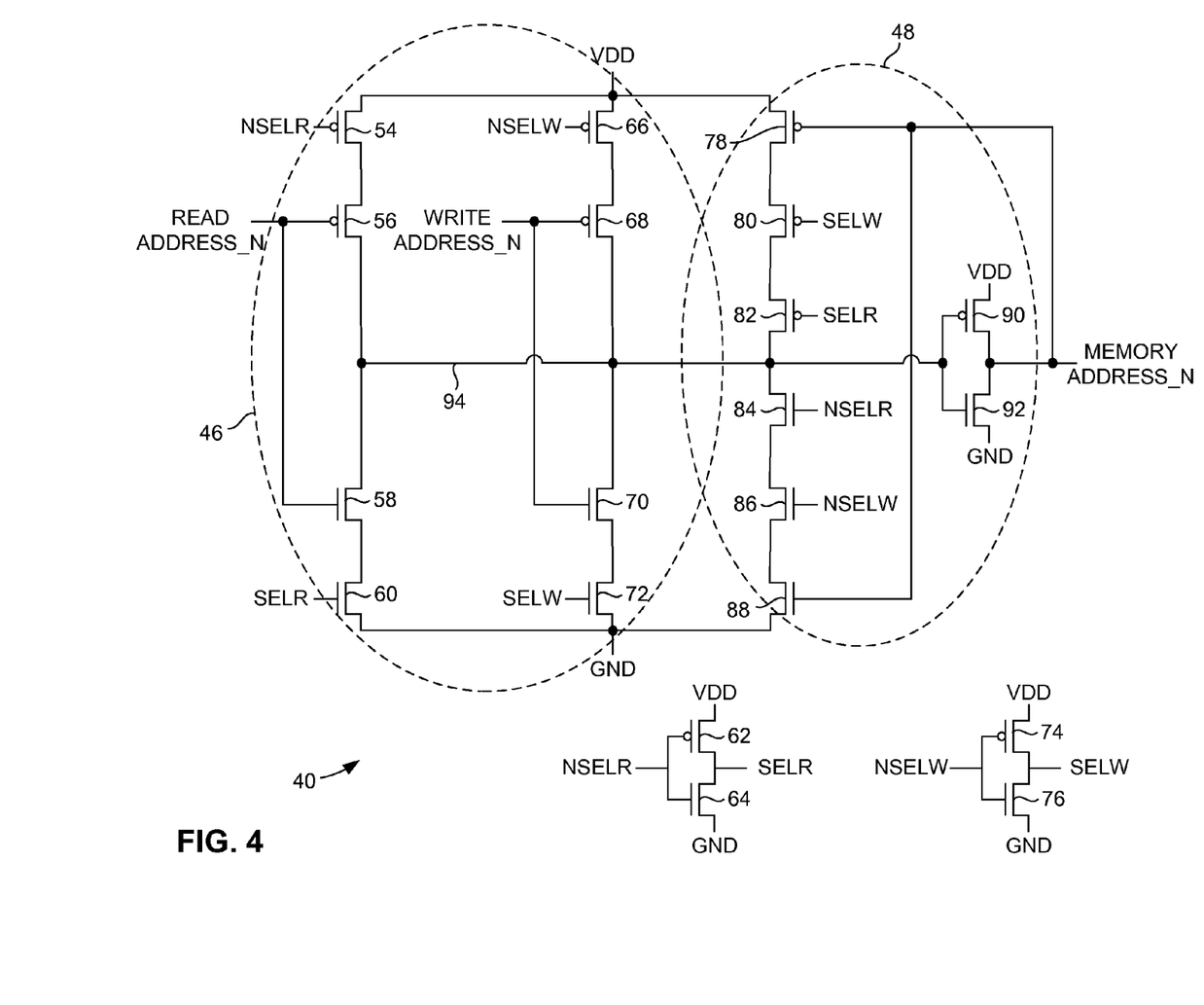
FIG. 4 is a schematic diagram of an exemplary MUX-latch of the PDP memory system of FIG. 3.

As illustrated in FIG. 4, in the exemplary embodiment address selection logic 46 and latching logic 48 each comprise transistor circuitry. Although in the exemplary embodiment this transistor circuitry comprises field-effect transistors (FETs), in other embodiments such transistor circuitry can comprise bipolar junction transistors or other types of transistors or similar devices.

Address selection logic 46 comprises a plurality of read address transistor circuits, where each read address transistor circuit corresponds to one bit of the read address and is controlled by the read select signal, and a plurality of write address transistor circuits, where each write address transistor circuit corresponds to one bit of the write address and is controlled by the write select signal. For purposes of clarity, only an exemplary one of the read address transistor circuits and an exemplary one of the write address transistor circuits is shown in FIG. 4.

The exemplary read address transistor circuit includes a first read address transistor 54, a second read address transistor 56, a third read address transistor 58, and a fourth read address transistor 60. Each read address bit ("READ ADDRESS_N" for an arbitrary "N"th bit) is connected to an input, such as one or more transistor gate terminals, of the exemplary read address transistor circuit. In the exemplary embodiment, the read address bit READ_ADDRESS_N is connected to the gate terminal of second read address transistor 56 and the gate terminal of third read address transistor 58. The gate terminal of first read address transistor 54 receives the read select signal ("NSELR"), and the gate terminal of fourth read address transistor 60 receives the complement of the read select signal ("SELR"). The complement of the read select signal is generated by an inverter comprising a PFET 62 and an NFET 64. The source terminal of first read address transistor 54 is coupled to a supply voltage ("VDD"). The drain terminal of first read address transistor 54 is connected to the source terminal of second read address transistor 56. The drain terminal of second read address transistor 56 is connected to the source terminal of third read address transistor 58. The drain terminal of third read address transistor 58 is connected to the source terminal of fourth read address transistor 60. The drain terminal of fourth read address transistor 60 is coupled to a ground potential ("GND"). In the exemplary embodiment, first read address transistor 54 and second read address transistor 56 are P-channel FETs or PFETs, while third read address transistor 58 and fourth read address transistor 60 are N-channel FETs or NFETs.

The exemplary write address transistor circuit includes a first write address transistor 66, a second write address transistor 68, a third write address transistor 70, and a fourth write address transistor 72. Each write address bit ("WRITE ADDRESS_N" for an arbitrary "N"th bit) is connected to an input, such as one or more transistor gate terminals, of the exemplary write address transistor circuit. In the exemplary embodiment, the write address bit WRITE_ADDRESS_N is connected to the gate terminal of second write address transistor 68 and the gate terminal of third write address transistor 70. The gate terminal of first write address transistor 66 receives the write select signal ("NSELW"), and the gate terminal of fourth write address transistor 72 receives the complement of the write select signal ("SELW"). The complement of the write select signal is generated by an inverter comprising a PFET 74 and an NFET 76. The source terminal of first write address transistor 66 is coupled to a supply voltage ("VDD"). The drain terminal of first write address transistor 66 is connected to the source terminal of second write address transistor 68. The drain terminal of second write address transistor 68 is connected to the source terminal of third write address transistor 70. The drain terminal of third write address transistor 70 is connected to the source terminal of fourth write address transistor 72. The drain terminal of fourth write address transistor 72 is coupled to a ground potential ("GND"). In the exemplary embodiment, first write address transistor 66 and second write address transistor 68 are P-channel FETs or PFETs, while third write address transistor 70 and fourth write address transistor 72 are N-channel FETs or NFETs.

Latching logic 48 comprises a plurality of latching transistor circuits, where each latching transistor circuit corresponds to one address bit. For purposes of clarity, only an exemplary one of the latching transistor circuits corresponding to the exemplary address bit "N" is shown in FIG. 4. The exemplary latching transistor circuit includes a first latching transistor 78, a second latching transistor 80, a third latching transistor 82, a fourth latching transistor 84, a fifth latching transistor 86, a sixth latching transistor 88, a seventh latching transistor 90, and an eighth latching transistor 92. The combination of first through sixth latching transistors 78-88 corresponds to the above-described inverter 52 in FIG. 3, while the combination of seventh and eighth latching transistors 90 and 92 corresponds to inverter 50 in FIG. 3.

The gate terminals of first and sixth latching transistors 78 and 88, respectively, receive the output of the combination of seventh and eighth transistors 90 and 92 (i.e., the output of inverter 50). The gate terminal of second latching transistor 80 receives the complement of the write select signal. The gate terminal of third latching transistor 82 receives the complement of the read select signal. The gate terminal of fourth latching transistor 84 receives the read select signal. The gate terminal of fifth latching transistor 86 receives the write select signal. The source terminal of first latching transistor 78 is coupled to the supply voltage. The drain terminal of first latching transistor 78 is coupled to the source terminal of second latching transistor 80. The drain terminal of second latching transistor 80 is coupled to the source terminal of third latching transistor 82. The drain terminal of third latching transistor 82 is coupled to the source terminal of fourth latching transistor 84. The drain terminal of fourth latching transistor 84 is coupled to the source terminal of fifth latching transistor 86. The drain terminal of fifth latching transistor 86 is coupled to the source terminal of sixth latching transistor 88. The drain terminal of sixth latching transistor 88 is coupled to the ground potential.

Significantly, a common node 94 (or latching node) is defined by the junction of the drain terminal of second read address transistor 56, the source terminal of third read address transistor 58, the drain terminal of second write address transistor 68, the source terminal of third write address transistor 70, the drain terminal of third latching transistor 82, the source terminal of fourth latching transistor 84, and the gate terminals of seventh and eighth latching transistors 90 and 92. Common node 94 at which these transistor terminals are interconnected is represented by the overlap between address selection logic 46 and latching logic 48 in FIG. 3. As a result of common node 94, address selection logic 46 and latching logic 48 are inter-dependent and essentially physically inseparable. Stated another way, some of the same transistors are involved in both the address selection and latching functions. Although the inputs of MUX-latch 40 include one ("N"th) bit of the read address and one ("N"th) bit of the write address that are received by address selection logic 46, and the output of MUX-latch 40 is the "N"th bit of the multiplexed and latched read and write addresses produced by latching logic 48, latching logic 48 is not merely cascaded onto the output of address selection logic 46. Rather, as described in further detail below, a state change in the read select or write select signal directly or immediately results in a state change in both address selection logic 46 and latching logic 48. That is, MUX-latch 40 both multiplexes and latches an address (i.e., a read address or a write address) in response to a single change in state of the read select or write select signals. The significance of this effect will become more apparent with reference to the method of operation described below with regard to FIG. 5.

Figure 5:
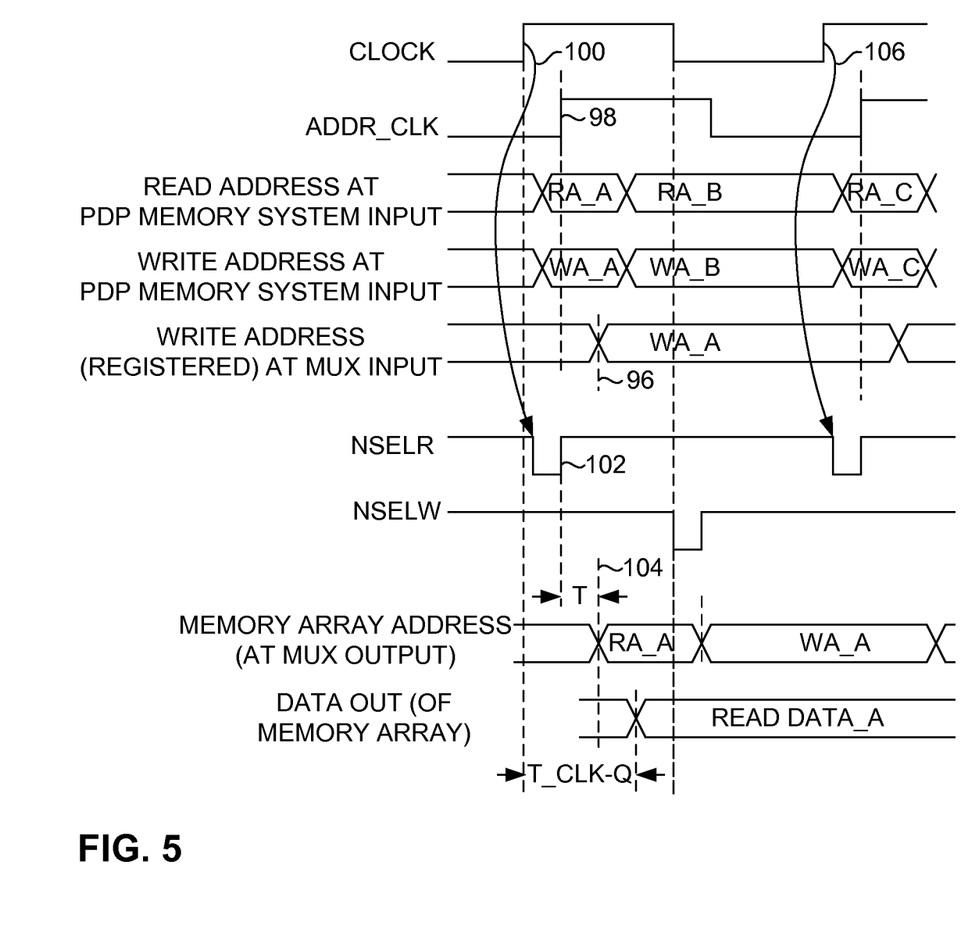
FIG. 5 is a timing diagram illustrating an exemplary instance of operation of the PDP memory system of FIG. 3.

As illustrated in FIG. 5, timing and control logic 42 (FIG. 3) generates an address clock signal ("ADDR_CLK") that corresponds to the master clock signal ("CLOCK") by being a delayed version of the master clock signal. Although in the exemplary embodiment the address clock is delayed from the master clock by an amount such as, for example, about 20 percent of the master clock cycle, in other embodiments the address clock can be delayed from the master clock by any suitable amount of zero or more.

In FIG. 5 a first exemplary write address is denoted "WA_A," and a first exemplary read address denoted "RA_A." The write address that is input to PDP memory system 36 (FIG. 3) becomes registered at time 96 into write address register 44 (FIG. 3) in response to the rising edge 98 of the address clock. As a result of the time that write address register 44 inherently takes to register (i.e., store) the write data, the registered write address does not become present at the input of MUX-latch 40 until time 96. The read address that is input to PDP memory system 36 is not similarly registered. Rather, the read address that is input to PDP memory system 36 is immediately present at the input of MUX-latch 40 in association with the same master clock cycle associated with the registering of the write address into write address register 44. The timing of the write operation is thus similar to the timing of the conventional write operation described above with regard to FIG. 2, while the timing of the read operation differs from the timing of the conventional read operation described above with regard to FIG. 2.

Timing and control logic 42 generates or activates the read select signal ("NSELR") in response to the rising edge of the master clock signal, as indicated by the curved arrow 100. As is desirable to minimize delay between this rising edge of the master clock and the (active-low) read select signal going low, the read select signal goes low almost immediately following the rising edge of the master clock signal. The width of the read select signal, i.e., the time during which it remains low, is determined by a timer (not separately shown) in timing and control logic 42. The width of the read select signal (pulse) is preferably as short as possible without compromising the ability of the operation of MUX-latch 40 to be triggered by the trailing edge of the read select signal.

The rising edge 102 of the read select signal causes MUX-latch 40 to both multiplex (i.e., select) the read address and latch the selected read address in a single operation or state change that is completed at time 104. That is, the state change represented by the transition of the read select signal from low to high results in a single state change in MUX-latch 40 representing both the multiplexing and the latching of the read address. By time 104, the read address that had been present at the input of MUX-latch 40 before this state change has become latched at the output of MUX-latch 40. As the output of MUX-latch 40 is directly connected to the address input of memory array 38, the read address is immediately present at the address input of memory array 38. In response to the read address ("MEMORY ARRAY ADDRESS") at the input of memory array 38, memory array 38 reads the memory location represented by that read address and outputs the data read from that memory location ("DATA OUT").

Significantly, the delay "T" between the rising edge 102 of the read select signal and the completion of the multiplexing and latching of the read address at time 104 is analogous to the combined or total delay T1+T2 in FIG. 2, yet T is much less than T1+T2. This is because the multiplexing delay and the latching delay in MUX-latch 40 are coincident with one another rather being incurred one after the other. Accordingly, the clock-to-Q time ("T_CLK-Q") for read operations in PDP memory system 36 is much less than the clock-to-Q time in conventional PDP memory system 10 (FIG. 1.) In other words, a memory read operation in PDP memory system 36 can be performed much faster than a memory read operation in conventional PDP memory system 10.

As is characteristic of PDP memory systems, a write operation immediately follows each read operation in PDP memory system 36. Accordingly, timing and control logic 42 generates or activates the write control signal ("NSELW") in response to the falling edge of the master clock signal, as indicated by the curved arrow 100. The width of the write select signal, i.e., the time during which it remains low, is determined by a timer (not separately shown) in timing and control logic 42. The width of the write select signal (pulse) is preferably as short as possible without compromising the ability of the operation of MUX-latch 40 to be triggered by the trailing edge of the write select signal. Since the timing of a write operation in PDP memory system 36 is the same as the timing of write operation, the write operation is not described in further detail herein.

One or more illustrative or exemplary embodiments of the invention have been described above. However, it is to be understood that the invention is defined by the appended claims and is not limited to the specific embodiments described.

What is claimed is:

1. A pseudo-dual-port (PDP) memory system having a read address input receiving a read address and a write address input receiving a write address, comprising:

a memory array configured to perform read operations and write operations in association with a master clock signal;

timing and control logic configured to generate select signals including a read select signal and a write select signal for both a read operation and a write operation performed upon the memory array in association with a single master clock signal cycle using multiplexed and latched read and write addresses provided to an address input of the memory array; and a multiplexer-latch comprising address selection logic responsive to the read select signal and the write select signal and latching logic responsive to the read select signal and the write select signal, the latching logic providing the multiplexed and latched read and write addresses directly to the input of the memory array; and a write address register having a data input and a data output, the write address input of the PDP memory system connected to the data input of the write address register, the data output of the write address register comprising a plurality of write address bits and directly connected to a write address input of the multiplexer-latch;

wherein the read address input of the PDP memory system comprises a plurality of read address bits and is directly connected to the multiplexer-latch.

2. The PDP memory system of claim 1, wherein the multiplexer-latch both multiplexes and latches an address in response to a single change in state of one of the read select signal and the write select signal.

3. The PDP memory system of claim 1, wherein the write address register operates in response to an address clock signal corresponding to the master clock signal.

4. The PDP memory system of claim 1, wherein:
the address selection logic comprises a plurality of read address transistor circuits controlled by the read select signal and a plurality of write address transistor circuits controlled by the write select signal;
each write address bit is connected to an input of one of the write address transistor circuits;
each read address bit is connected to an input of one of the read address transistor circuits;
the latching logic comprises a latching transistor circuit controlled by both the read select signal and the write select signal; and
an output of the one of the write address transistor circuits, an output of one of the read address transistor circuits, and an output of the latching logic are connected together at a common node defining a bit of the multiplexed and latched read and write addresses.

5. The PDP memory system of claim 4, wherein:
each write address transistor circuit comprises a first transistor, a second transistor, a third transistor and a fourth transistor, wherein the first transistor of the write address transistor circuit is controlled by the write select signal, the second transistor of the write address transistor circuit receives one of the write address bits, the third transistor of the write address transistor circuit receives the one of the write address bits, and the fourth transistor of the write address transistor circuit is controlled by a complement of the write select signal; and
each read address transistor circuit comprises a first transistor, a second transistor, a third transistor and a fourth transistor, wherein the first transistor of the read address transistor circuit is controlled by the read select signal, the second transistor of the read address transistor circuit receives one of the read address bits, the third transistor of the read address transistor circuit receives the one of the read address bits, and the fourth transistor of the read address transistor circuit is controlled by a complement of the read select signal.

6. The PDP memory system of claim 5, wherein:
the first and second transistors of the write address transistor circuit are connected between a supply voltage and the common node;
the third and fourth transistors of the write address transistor circuit are connected between a ground potential and the common node;
the first and second transistors of the read address transistor circuit are connected between a supply voltage and the common node; and
the third and fourth transistors of the read address transistor circuit are connected between a ground potential and the common node.

7. The PDP memory system of claim 4, wherein the latching transistor circuit comprises a first transistor, a second transistor, a third transistor and a fourth transistor, a fifth transistor and a sixth transistor.

8. The PDP memory system of claim 7, wherein:
the first, second and third transistors of the latching transistor circuit are connected between a supply voltage and the common node;
the fourth, fifth and sixth transistors of the latching transistor circuit are connected between a ground potential and the common node;

the fifth transistor of the latching transistor circuit is controlled by the write select signal;
the first transistor of the latching transistor circuit is controlled by a complement of the write select signal;
the fourth transistor of the latching transistor circuit is controlled by a the read select signal; and
the third transistor of the latching transistor circuit is controlled by a complement of the read select signal.

9. A method of operation of a pseudo-dual-port (PDP) memory system, wherein the PDP memory system comprises a memory array, timing and control logic, a write address register, and a multiplexer-latch, the multiplexer-latch comprising address selection logic and latching logic, the method comprising:
providing a write address to an input of the PDP memory system by providing the write address to a write address register;
registering the write address in the write address register in response to an address clock signal corresponding to the master clock signal, an output of the write address register providing a registered write address;
providing a read address to an input of the PDP memory system by providing the read address directly to an input of the multiplexer-latch on a same cycle of the master clock signal as the write address is provided to an input of the write address register, wherein the read address is provided to the input of the multiplexer-latch without being registered;
performing a read operation from the read address in association with one cycle of the master clock signal, wherein the timing and control logic generates the read select signal in association with the one cycle of the master clock signal, and wherein the multiplexer-latch utilizes the address selection logic to select the read address in association with the one cycle of the master clock signal in response to the read select signal and also utilizes the latching logic to latch to the read address directly from the input of the address selection logic to an address input of the memory array in association with the read operation in response to the read select signal; and
performing a write operation to the write address immediately following the read operation and in association with the one cycle of the master clock signal, wherein the timing and control logic generates the write select signal in association with the one cycle of the master clock signal, and wherein the multi-plexer latch utilizes the address selection logic to select the write address in association with the one cycle of the master clock signal in response to the write select signal and also utilizes the latching logic to latch the registered write address to the address input of the memory array in association with the one cycle of the master clock signal in response to the write select signal.

10. The method of claim 9, wherein:
performing a read operation includes the multiplexer-latch both multiplexing and latching the read address in response to a single change in state of the read select signal; and
performing a write operation includes the multiplexer-latch both multiplexing and latching the write address in response to a single change in state of the write select signal.

11. The method of claim 10, wherein the address selection logic comprises a plurality of read address transistor circuits controlled by the read select signal and a plurality of write address transistor circuits controlled by the write select signal, the write address and the read address each comprise a plurality of address bits, each write address bit is connected to an input of one of the write address transistor circuits, each read address bit is connected to an input of one of the read address transistor circuits, and the latching logic comprises a latching transistor circuit controlled by both the read select signal and the write select signal, and wherein:

performing a read operation includes the latching logic latching an address bit directly from the input of the address selection logic to an address input of the memory array by providing the address bit at a common node defining an output of one of the write address transistor circuits, an output of one of the read address transistor circuits.

12. A pseudo-dual-port (PDP) memory system, comprising:
a single-port memory array;
timing and control logic that generates a read select signal and a write select signal for a read operation and a write operation, respectively, in response to a master clock signal;
a write address register that receives a write address provided as an input to the PDP memory system and registers the received write address;
a multiplexer-latch connected to the output of the write address register such that the multiplexer-latch receives the write address after being registered by the write address register, wherein the multiplexer-latch receives a read address provided as a direct input to the PDP memory system, the multiplexer-latch comprising:
address selection logic that is responsive to the read select signal and the write select signal; and
latching logic that is also responsive to the read select signal and the write select signal, wherein an output of the latching logic is connected directly to the single-port memory array.

13. A pseudo-dual-port (PDP) memory system having a single read address input and a single write address input, the PDP memory system comprising:
a memory array;
timing and control logic that generates a read select signal and a write select signal for a read operation and a write operation, respectively, in response to a master clock signal;
a write address register that receives a write address from the single write address input and registers the received write address;
a multiplexer-latch connected to the output of the write address register such that the multiplexer-latch receives the write address after being registered by the write address register, wherein the multiplexer-latch receives a read address from the single read address input without the read address being registered, the multiplexer-latch comprising:
address selection logic that is responsive to the read select signal and the write select signal; and
latching logic that is also responsive to the read select signal and the write select signal, wherein the multiplexer-latch both multiplexes and latches an address in response to a single change in state of one of the read select signal and the write select signal, and wherein the latching logic is not a separate and distinct logic stage connected to an output of the address selection logic.

14. The PDP memory system of claim 13, wherein the timing and control logic further provides an address clock signal to the write address register, wherein the write address received at the single write address input is clocked into the write address register by a state change in the address clock signal.

15. The PDP memory system of claim 13, wherein the memory array comprises a single-port memory array.

16. The PDP memory system of claim 15, wherein data written to the single-port memory array is written to the single-port memory array in the absence of being registered.

17. A method of operating a pseudo-dual-port (PDP) memory system with a clock signal, the method comprising:
receiving a read address as an input to the PDP memory system;
receiving a write address as an input to the PDP memory system;
in response to detecting a rising or falling edge of the clock signal, causing a read select signal to transition from a first value to a second value;
in response to the read select signal transitioning from the first value to the second value, providing the read address directly to a multiplexer-latch of the PDP memory system without registering the read address;
in response to detecting the rising or falling edge of the clock signal, causing the write address to be registered at a write address register, wherein the write address is registered substantially simultaneous with providing the read address directly to the multiplexer-latch;
simultaneously multiplexing and latching the read address with the multiplexer-latch and then immediately presenting the latched read address to a memory array of the PDP memory system; and
reading data from a memory location of the memory array that is associated with the read address.

18. The method of claim 17, further comprising:
in response to detecting the rising or falling edge of the clock signal, causing a write select signal to transition from a first value to a second value, wherein the write select signal transitions after the read select signal transitions;
following registration of the write address and following the simultaneous multiplexing and latching of the read address, simultaneously multiplexing and latching the write address with the multiplexer-latch and then immediately presenting the latched write address to the memory array; and
writing data to a memory location of the memory array that is associated with the write address.

19. The method of claim 17, wherein the memory array corresponds to a single-port memory array.

* * * * *